(12) United States Patent
Ho et al.

(10) Patent No.: US 6,988,879 B2
(45) Date of Patent: Jan. 24, 2006

(54) APPARATUS AND METHOD FOR REDUCING SUBSTRATE WARPAGE

(75) Inventors: Shu Chuen Ho, Singapore (SG); Teng Hock Kuah, Singapore (SG); Kock Hien Eugene Wee, Singapore (SG); Jian Wu, Singapore (SG)

(73) Assignee: ASM Technology Singapore PTE LTD, Singapore (SG)

( * ) Notice: Subject to any disclaimer, the term of this patent is extended or adjusted under 35 U.S.C. 154(b) by 200 days.

(21) Appl. No.: 10/274,598

(22) Filed: Oct. 18, 2002

(65) Prior Publication Data

US 2004/0077130 A1   Apr. 22, 2004

(51) Int. Cl.
B29C 45/14 (2006.01)
H01L 21/56 (2006.01)

(52) U.S. Cl. ............. 425/126.1; 294/106; 414/226.02; 414/753.1; 414/941

(58) Field of Classification Search ................ 425/116, 425/117, 125, 127, 129.1, 126.1; 294/106; 414/226.02, 753.1, 941
See application file for complete search history.

(56) References Cited

U.S. PATENT DOCUMENTS

| | | | | |
|---|---|---|---|---|
| 3,651,957 | A | * | 3/1972 | Ball et al. ............... 294/106 |
| 4,273,506 | A | * | 6/1981 | Thomson et al. .......... 294/106 |
| 4,384,918 | A | * | 5/1983 | Abe ...................... 216/71 |
| 4,453,757 | A | * | 6/1984 | Soraoka ................. 414/941 |
| 4,828,304 | A | * | 5/1989 | No et al. ................ 294/106 |
| 5,200,202 | A | * | 4/1993 | Ahn .................... 425/126.1 |
| H1373 | H | * | 11/1994 | Durham et al. ........... 414/786 |
| 5,492,866 | A | * | 2/1996 | Nishikawa .............. 29/827 |
| 5,530,516 | A | * | 6/1996 | Sheets .................. 355/53 |
| 5,564,682 | A | * | 10/1996 | Tsuji .................... 269/21 |
| 5,622,731 | A | * | 4/1997 | Fierkens ................. 425/384 |
| 5,915,910 | A | * | 6/1999 | Howells et al. ........ 414/331.17 |
| 5,937,993 | A | * | 8/1999 | Sheets et al. ........... 414/941 |
| 6,013,541 | A | * | 1/2000 | Tan et al. ............... 438/106 |
| 6,279,976 | B1 | * | 8/2001 | Ball .................... 414/941 |
| 6,369,439 | B1 | | 4/2002 | Tao et al. ............... 257/666 |
| 6,612,590 | B2 | * | 9/2003 | Coomer et al. .......... 279/158 |
| 6,638,004 | B2 | * | 10/2003 | Berger et al. ........... 414/800 |
| 6,756,751 | B2 | * | 6/2004 | Hunter ................. 318/135 |

FOREIGN PATENT DOCUMENTS

| | | | | |
|---|---|---|---|---|
| DE | 1506502 | A | * | 7/1969 |
| JP | 62149141 | A | * | 7/1987 |
| JP | 62295840 | A | * | 12/1987 |
| JP | 01165131 | A | * | 6/1989 |
| JP | 02146753 | A | * | 6/1990 |
| JP | 03129864 | A | * | 6/1991 |
| JP | 03272156 | A | * | 12/1991 |
| JP | 04064216 | A | * | 2/1992 |
| JP | 05335361 | A | * | 12/1993 |
| JP | 2001246640 | A | * | 9/2001 |
| JP | 2002057451 | A | * | 2/2002 |

* cited by examiner

Primary Examiner—Robert B. Davis
(74) Attorney, Agent, or Firm—Ostrolenk, Faber, Gerb & Soffen, LLP

(57) ABSTRACT

The invention provides an apparatus and method for reducing warpage of a substrate undergoing a molding process, comprising a conveying device for transporting the substrate during molding and pressure means adapted to act on the substrate whereby to maintain the flatness of the substrate. Using the invention, it is possible to provide an apparatus and method which are usable with conventional substrates and which reduce reliance on material formulation to maintain flatness of the substrate.

30 Claims, 7 Drawing Sheets

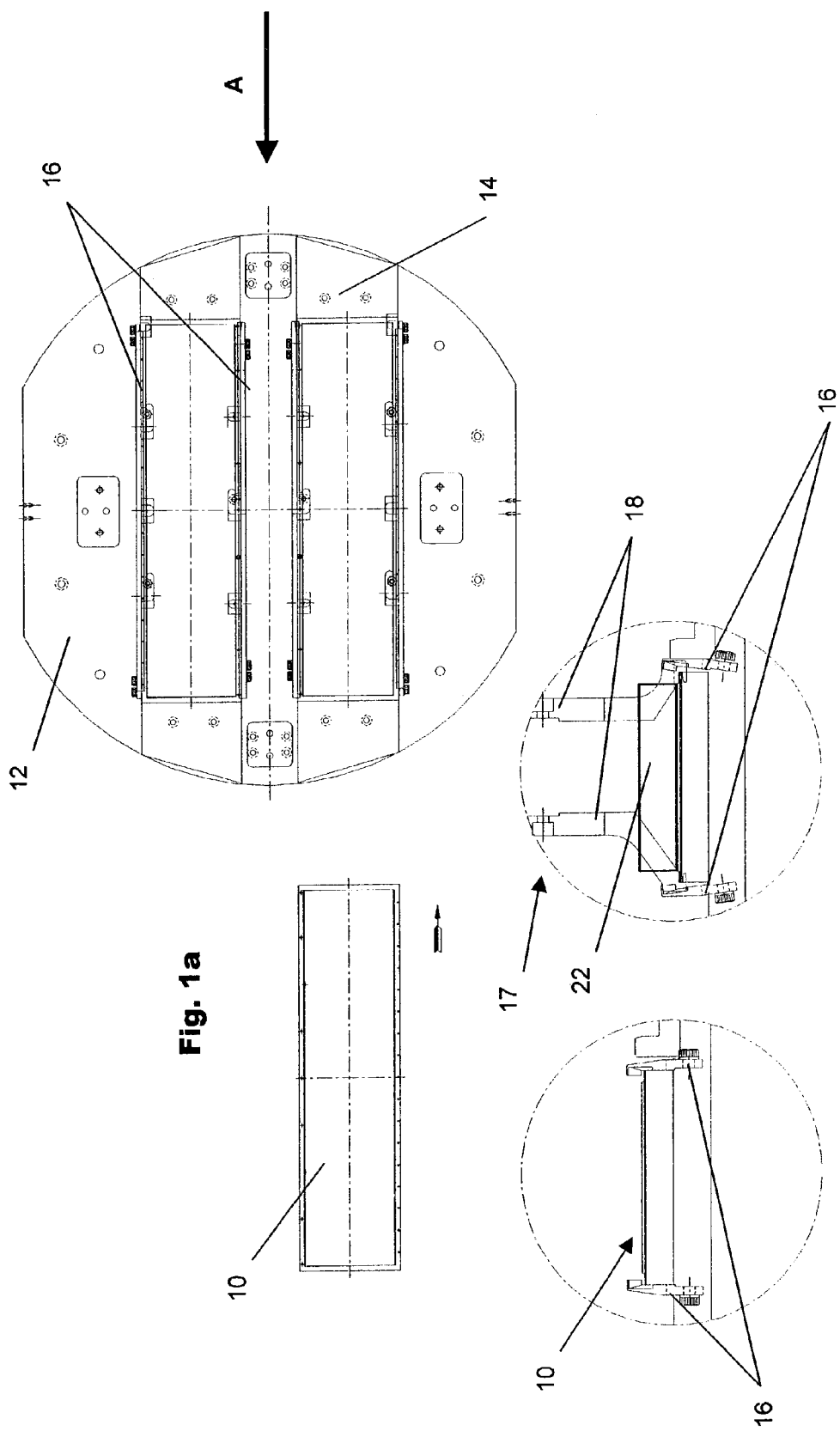

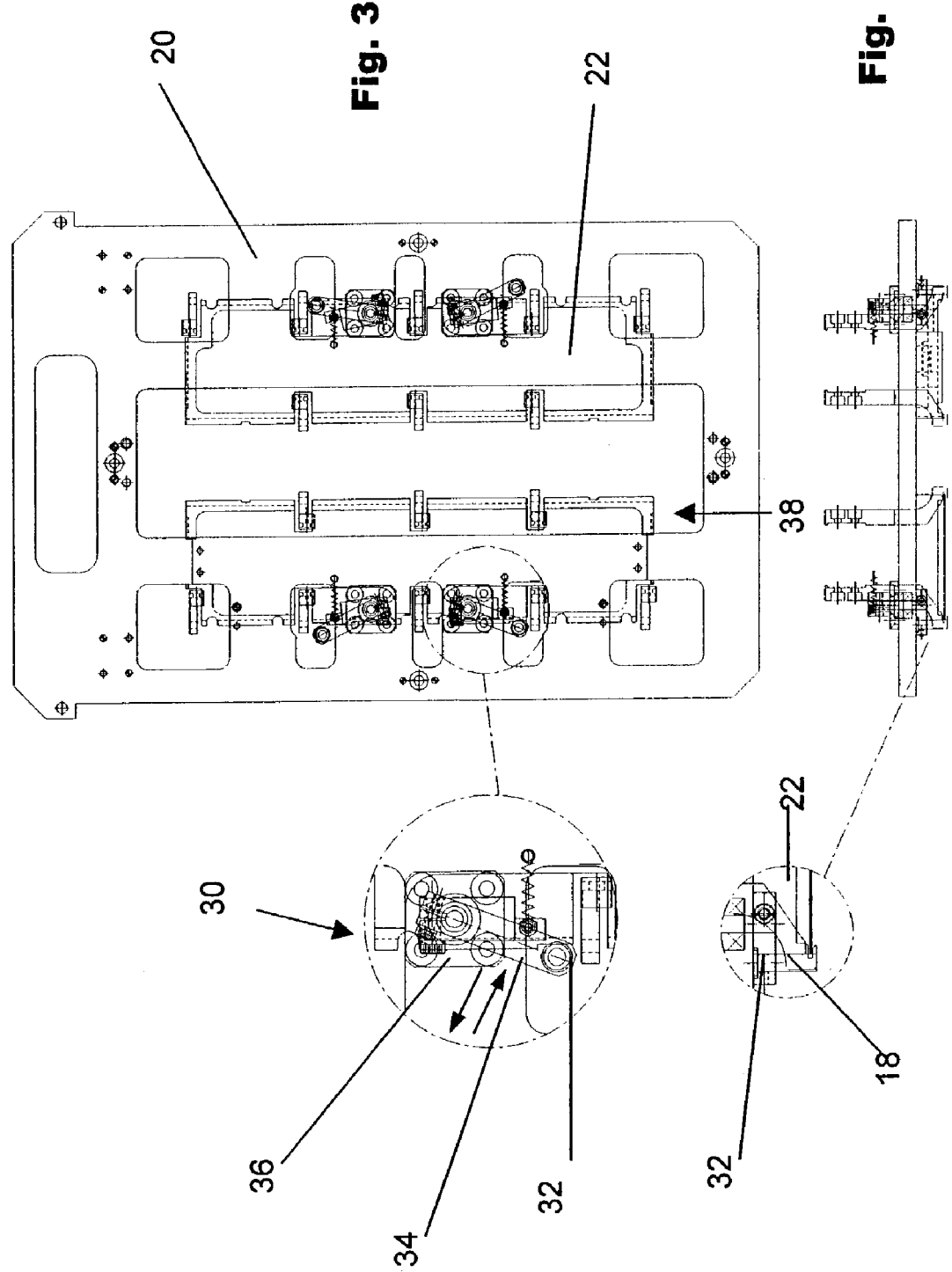

APPARATUS AND METHOD FOR REDUCING SUBSTRATE WARPAGE

FIELD OF THE INVENTION

The invention relates to an apparatus and method for reducing warpage in a substrate, such as semiconductor leadframes or Ball-Grid Array ("BGA") substrates. In particular, the invention seeks to reduce warpage of a substrate due to temperature changes when processing the substrate.

BACKGROUND AND PRIOR ART

In the semiconductor packaging industry, semiconductor chips are typically attached to substrates such as leadframes or BGA substrates during the fabrication process. After electrical connections are made between these semiconductor chips and the substrates, the semiconductor chips are encapsulated with encapsulation material (such as resin) using molding processes. After molding, the substrates are processed to remove cull formed during molding, and the encapsulated semiconductor chips are then singulated to complete the packaging process.

During the packaging process, and in particular during molding, the substrate is heated prior to and during the molding process. The increased temperature is required to allow the encapsulation material to form properly on the substrate and around the semiconductor chip. After the molding process is completed, the substrate is cooled before the cull is removed. Due to the heating and cooling of the substrate during the aforementioned process, the substrate is subjected to thermal expansion and contraction. As a result, warpage would tend to occur in the substrate, which affects the quality of the final product. Furthermore, warpage may cause damage to the fragile semiconductor chip.

Various methods have been devised to reduce warpage caused by such thermal expansion and contraction. Many of these methods utilize material formulation methods, to manufacture the substrate with certain physical properties to make it less prone to warpage.

Another method may be to include a metal layer surrounding the substrate areas to increase the stiffness of the entirety of the strip of substrate, such as in U.S. Pat. No. 6,369,439 for "Strip of Semiconductor Package". Nevertheless, using special material formulations or adding layers of support to the substrates involve increased manufacturing costs, and they may not reduce warpage sufficiently to justify the increased costs.

Therefore, it would be advantageous to adopt an apparatus and method to reduce warpage to substrates during a semiconductor packaging process without having to resort to special formulations or constructions of the substrates.

SUMMARY OF THE INVENTION

It is thus an objective of the invention to seek to provide an apparatus and method to reduce warpage of a substrate during handling of the substrate.

According to a first aspect of the invention there is provided apparatus for reducing warpage of a substrate undergoing a molding process, comprising:
  (i) a conveying device for transporting the substrate during molding; and
  (ii) pressure means adapted to act on the substrate whereby to maintain the flatness of the substrate.

According to a second aspect of the invention there is provided a method for reducing warpage of a substrate undergoing a molding process comprising the step of maintaining pressure on the substrate to keep it substantially flat during the molding process.

Using the invention it is possible to provide an apparatus and method which are usable with conventional substrates and which reduce the reliance on material formulation.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

FIG. 1a illustrates a substrate being introduced to a turntable, whereas FIG. 1b is a side view of the turntable from direction A of FIG. 1a showing turntable grippers according to a preferred embodiment of the invention holding the substrate.

FIG. 1c shows an onloader about to remove a substrate from the turntable for loading onto a molding surface of a mold piece;

FIGS. 3a and 3b are top and side views respectively of the molding surface illustrating a substrate side pusher assembly according to a preferred embodiment of the invention to align each substrate to a molding datum;

DETAILED DESCRIPTION OF THE PREFERRED EMBODIMENT OF THE INVENTION

Figure 2A:
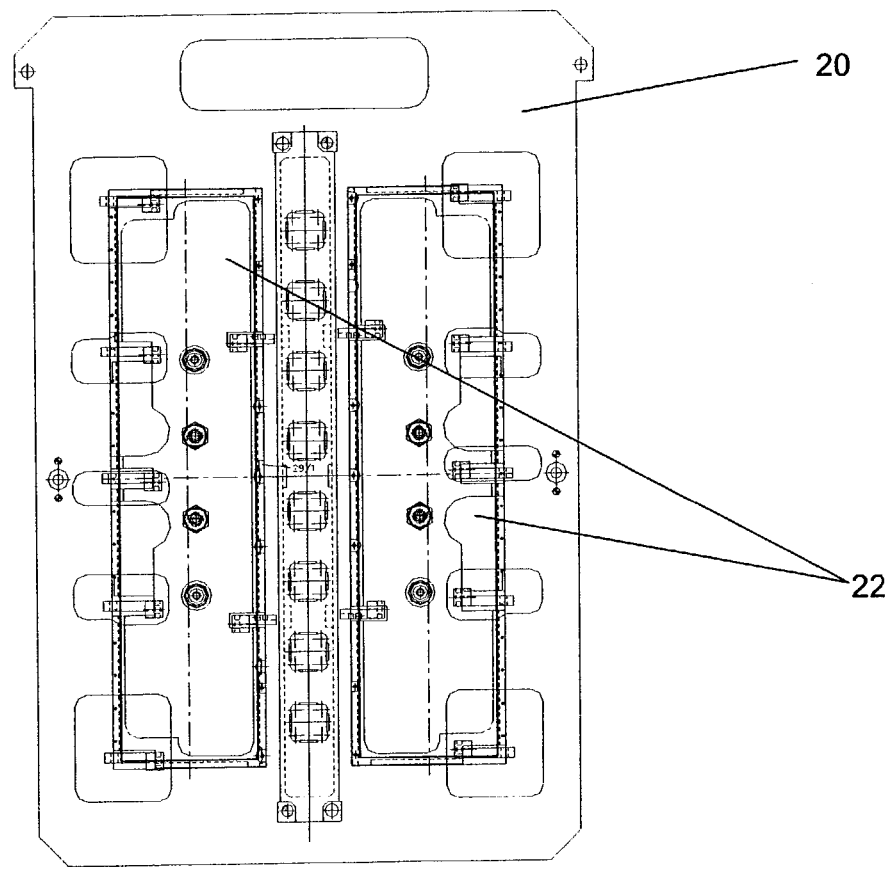
FIGS. 2a and 2b are top and side views respectively of the onloader placing substrates onto a molding surface of a mold.

Referring to the drawings, FIG. 1a illustrates a substrate 10 being introduced to a delivery platform, such as a turntable 12, just prior to a molding process. One or more semiconductor chips (not shown) have already been attached to the substrate 10 and it is assumed that electrical connections have already been made between the semiconductor chip(s) and the substrate 10. The delivery platform or turntable 12 functions to heat up and align the substrate 10 before it goes through a molding process. The substrate 10 is slid into a substrate case 14, which includes a pair of gripper means or turntable grippers 16 to flatten and hold each substrate 10 against the surfaces of the turntable 12.

FIG. 1b is a side view of the turntable 12 from direction A of FIG. 1a showing the turntable grippers 16 according to a preferred embodiment of the invention holding the substrate 10. The turntable grippers 16 hold down the substrate 10 along its sides so that as the substrate 10 is heated, warping is minimized.

FIG. 1c shows a conveying device, such as an onloader 17 about to remove the substrate 10 from the turntable 12 for placing the substrate 10 onto a molding surface 20 of a mold piece. The onloader 17 comprises onload grippers 18 to grip the sides of the substrate 10 to lift it. At the same time, the turntable grippers 16 are opened to release the substrate 10 from the turntable 12. Further, there are pressure means carried by as by being coupled to the onloader 17, which may be an onloader press plate 22, that presses onto the substrate 10 while it is being gripped and lifted so that warpage of the substrate 10 during the onloading process is reduced.

Figure 2B:
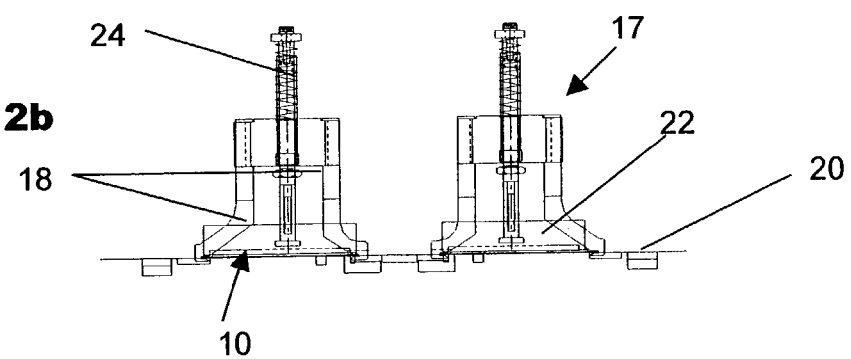

FIGS. 2a and 2b are top and side views of the onloader 17 placing the substrate 10 onto a molding surface 20 of a mold. As the substrate 10 is placed onto the molding surface 20, the onload press plate 22 is still pressing onto the substrate 10 to reduce warpage. FIG. 2b illustrates the parts of the onloader 17 including the onload grippers 18, onload press plate 22 and a press plate cylinder 24. The press plate cylinder 24 serves to control the onload press plate 22 and provide a force to push down on the substrate 10. The onloader 17 is shown pushing the substrate 10 against the molding surface 20.

FIGS. 3a and 3b are top and side views respectively of the molding surface 20 illustrating aligning means, for example a substrate side pusher assembly 30, according to the preferred embodiment of the invention, to align each substrate 10 to a reference molding datum 38. The molding datum 38 indicates the required alignment of the substrate 10 on the molding surface 20. The substrate side pusher assembly 30 comprises a side pusher 32 connected to a lever 34, which is in turn connected to a cylinder 36. The lever 34 is pivotally arranged with respect to the side pusher 32 and cylinder 36 so that extension and contraction of the cylinder 36 result in corresponding inward and outward motion of the side pusher 32 as shown in the enlarged view of the substrate side pusher assembly 30 in FIG. 3a.

According to the preferred embodiment of the invention, once the onloader 17 places the substrate 10 on the mold surface 20, the onload grippers 18 release the substrate 10. The side pusher 32 is then activated to push each substrate 10 to align it with the molding datum 38. Once that is done, the onloader 17 moves down again so that the onloader press plate 22 pushes against the substrate 10. This allows vacuum suction devices or holes (not shown) in the molding surface 20 to hold the substrate 10 with suction pressure during the actual molding.

Figure 4A:
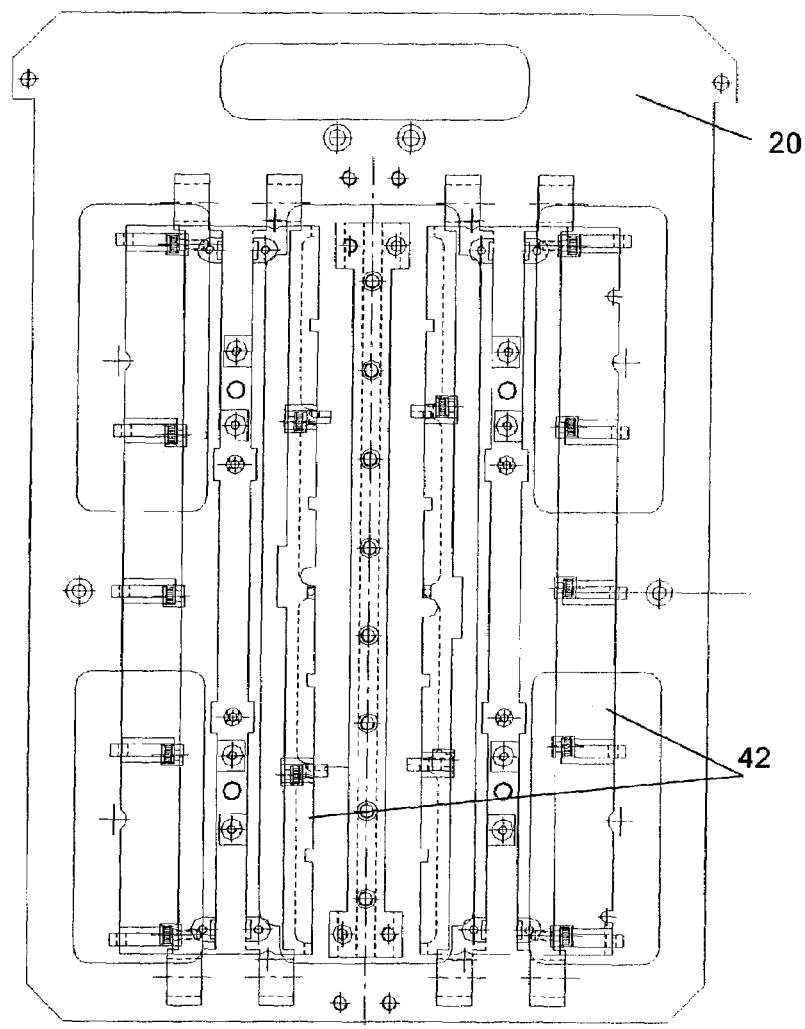
FIGS. 4a and 4b are top and side views respectively of an offloader about to remove the substrate from the molding surface of the mold after molding.
Figure 4B:
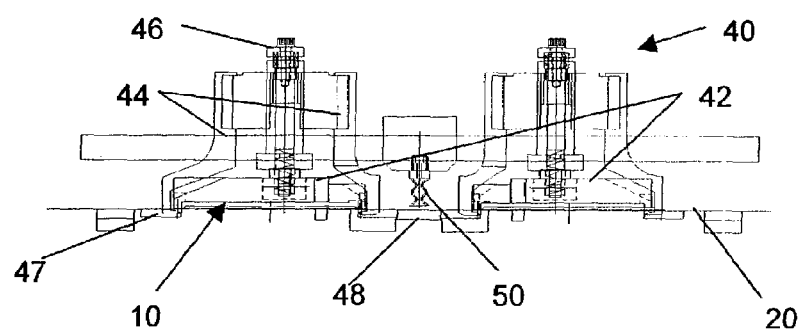

FIGS. 4a and 4b are top and side views respectively of another conveying device, such as an offloader 40 about to remove the substrate 10 from the molding surface 20 of the mold piece after molding. The offloader 40 comprises offloader grippers 44, an offloader press plate 42 and offloader cylinder 46 to control the offloader press plate 42. Vacuum suction on the substrate 10 is deactivated and the offloader 40 is lowered into a recess 47 so that the offloader gripper 44 grips the substrate 10. At the same time, a vacuum cup 50 is lowered with the offloader 40 to apply suction pressure to hold a portion of cull 48 that is typically produced around surfaces of substrates 10 that have been molded, during removal of the substrate 10 from the molding surface, since the weight of the cull 48 may introduce a bending force on the substrate 10.

The offloader press plate 42 of the conveying device or offloader 40 is lowered to press against the substrate 10, again to reduce warpage as the substrate 10 is lifted away from the molding surface 20 and carried towards a discharge station, which typically functions as a degating assembly.

Figure 5A:
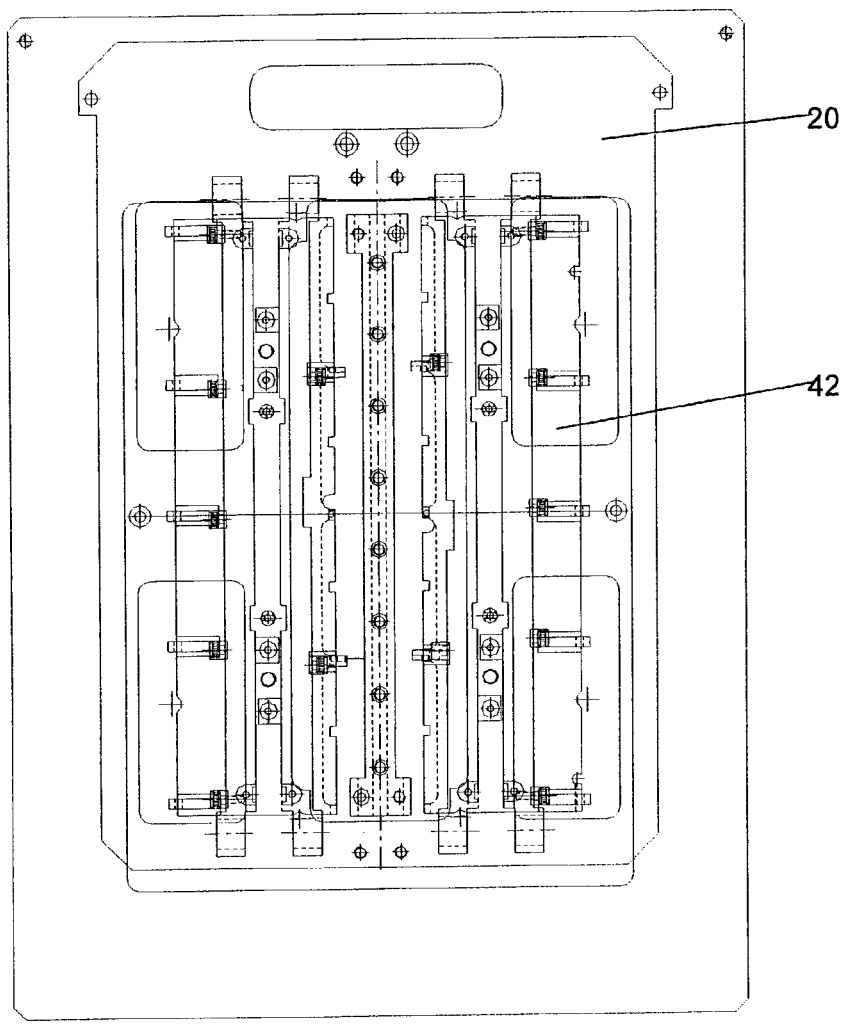
FIGS. 5a and 5b are top and side views respectively of the offloader placing substrates onto a degating bottom plate.
Figure 5B:
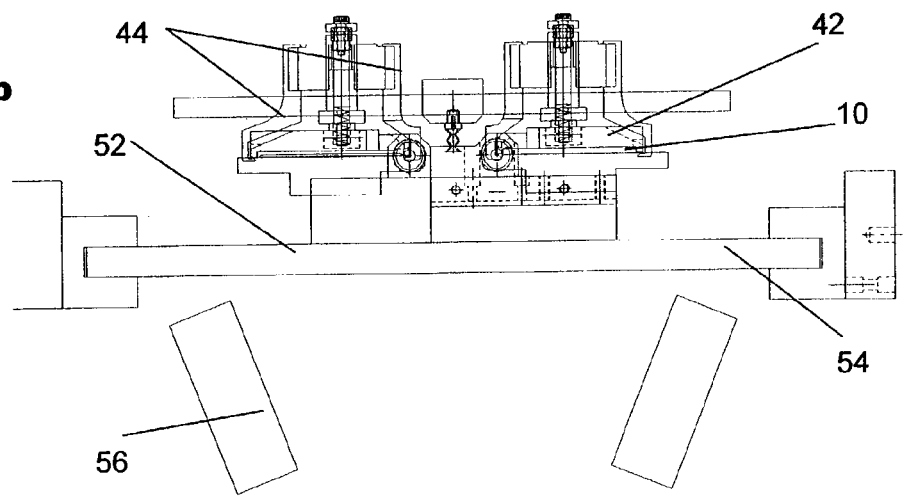

FIGS. 5a and 5b are top and side views of the offloader 40 placing the substrate 10 onto a degating bottom plate 52 of the degating assembly. The substrates 10 have been moved from the molding surface 20 to the degating bottom plate 52 on a degating bottom platform 54. A pair of degate bottom fans 56 are located below the degating bottom platform 54 to blow air onto the degating bottom plate 52 to cool the substrates 10. At the same time, it is preferable that the offloader press plate 42 continues to press against the substrates 10 for a pre-determined period of time, according to the type of substrate being processed and other factors. This helps to ensure that warpage in the substrates 10 during their initial cooling is minimized as far as possible. Thereafter, the offloader 40 is removed from contact with the substrate 10.

Figure 6A:
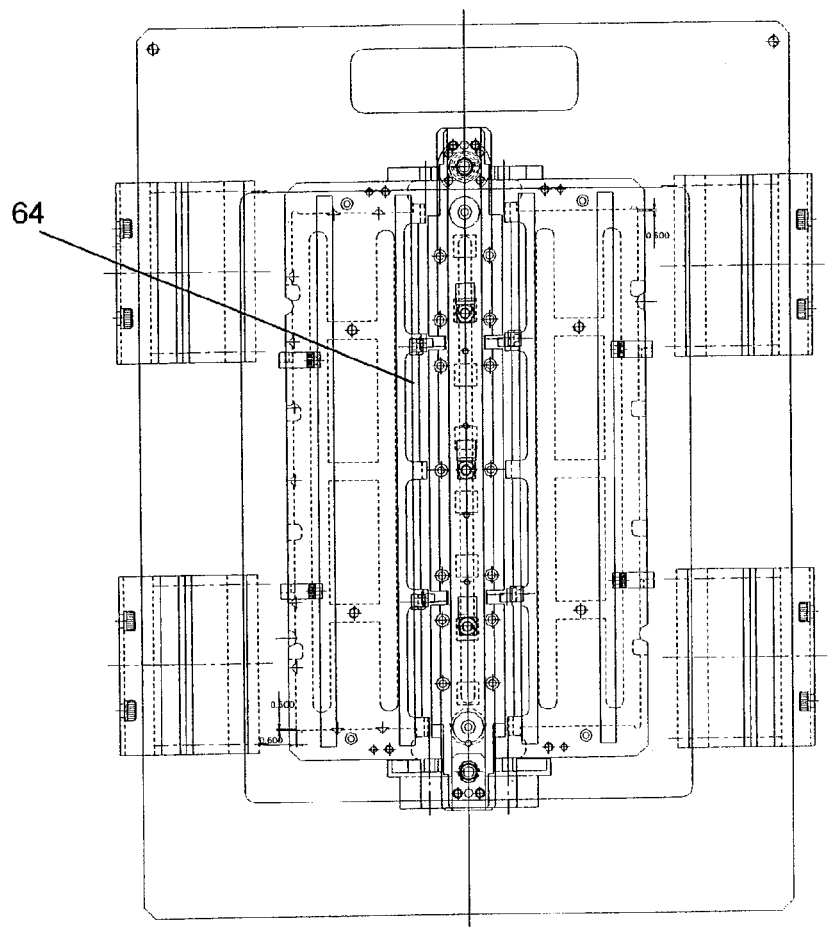
FIGS. 6a and 6b are top and side views respectively of the degate assembly including a degating top platform and degating bottom platform, and cooling mechanisms thereof.
Figure 6B:
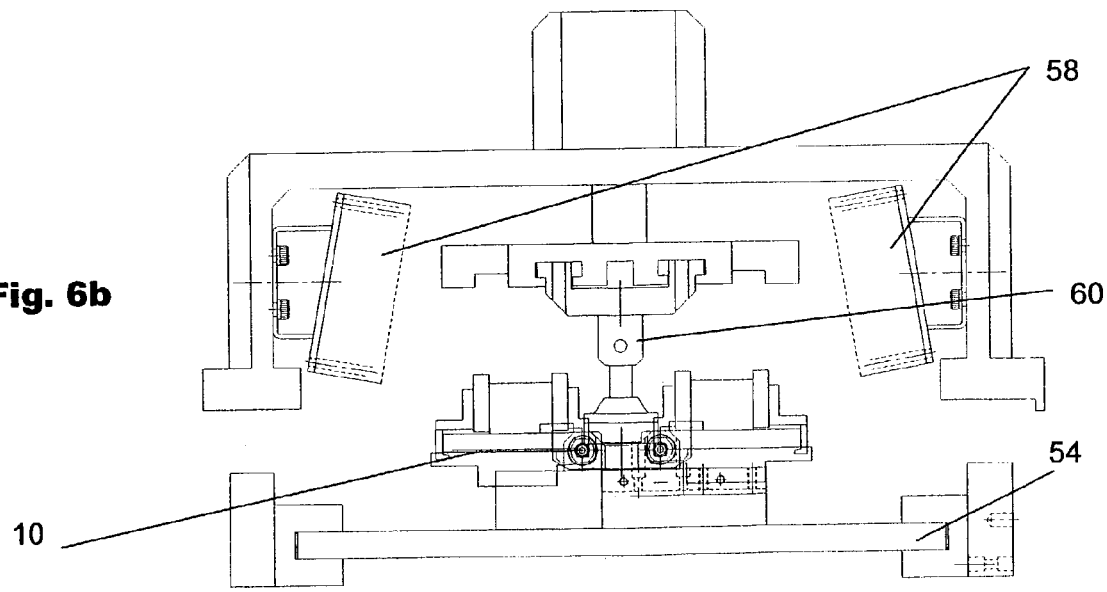

FIGS. 6a and 6b are top and side views of the degate assembly including a degating top platform 60 and the degating bottom platform 54, and cooling mechanisms thereof. The substrates 10 are sandwiched between the degating top platform 60 and degating bottom platform 54. The cooling mechanism also includes top cooling fans 58 and compressed or pressurized air that is introduced directly onto encapsulation material and cull 48 that has been molded onto the substrate 10.

Compressed or pressurized air is introduced to the molded packages and cull 48 via cooling paths 64. In essence, compressed air is introduced via two separate channels to the two substrates 10 shown in FIGS. 6a and 6b, and via a third channel to the cull 48. By introducing compressed air directly to the encapsulation material simultaneously via separate channels, together with the cooling of the general environment via the degate bottom fans 56 and the top cooling fans 58, this results in an increased cooling effect. As far as possible, the substrates 10 are flattened by a compression force to reduce warpage.

Figure 7:
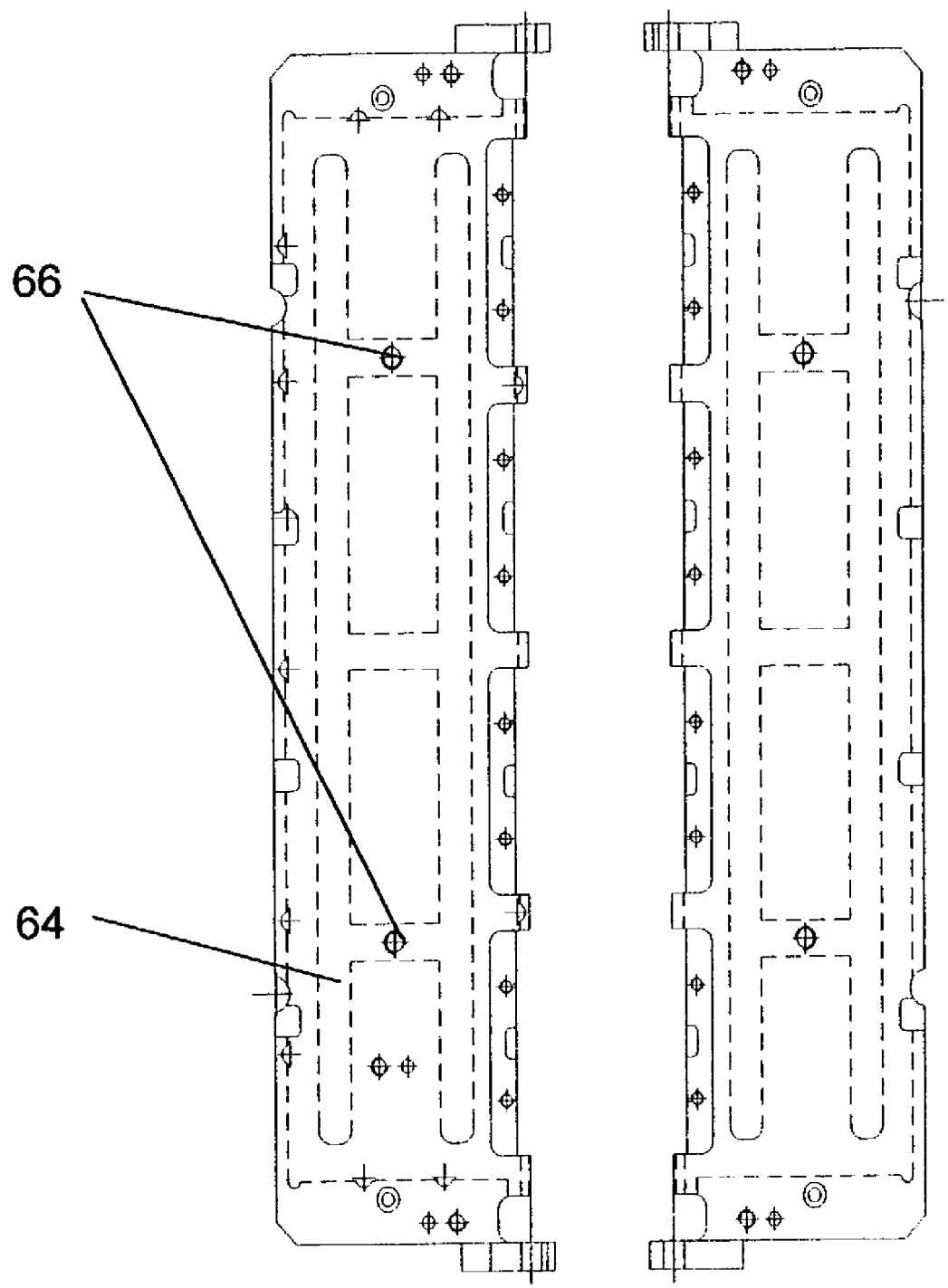
FIG. 7 is a top view of the degating top platform illustrating the air transmission channels thereof.

FIG. 7 is a top view of the degating top platform 60 illustrating the air transmission channels thereof. In particular, the air path 64 for the compressed air and air inlets 66 to channel air to the substrates 10 are illustrated.

The invention described herein is susceptible to variations, modifications and/or additions other than those specifically described and it is to be understood that the invention includes all such variations, modifications and/or additions which fall within the spirit and scope of the above description.

What is claimed is:

1. Apparatus for reducing warpage of a substrate undergoing a molding process, comprising:
   a conveyor for transporting the substrate to a mold;
   pressure means which moves with the conveyor and which is operable to apply pressure to the substrate during transportation to maintain the flatness thereof; and
   a molding surface on the mold that is configured to receive the substrate for molding.

2. Apparatus as defined in claim 1, wherein the pressure means comprises a press plate carried by the conveying device and which is adapted to apply pressure through contact with the substrate.

3. Apparatus as defined in claim 2, further including a press plate cylinder which controls the force exerted by the press plate.

4. Apparatus as defined in claim 1, wherein the substrate is transported to a mold from a delivery platform, and the delivery platform includes gripper means operable to keep the substrate substantially flat on the delivery platform.

5. Apparatus as defined in claim 1, further including alignment means located adjacent to a mold to align the substrate in relation to a reference datum to orientate it for molding.

6. Apparatus as defined in claim 5, wherein the alignment means comprises a side-pusher assembly.

7. Apparatus as defined in claim 1, further including means for applying force on the substrate to flatten it against a molding surface of a mold for a predetermined period of time.

8. Apparatus as defined in claim 7, wherein the means for applying force on the substrate on the mold surface is a surface of the conveying device.

9. Apparatus as defined in claim 1, further including a plurality of vacuum suction devices on a molding surface of the mold adapted to provide suction force to hold the substrate in position during molding.

10. Apparatus as defined in claim 1, further including vacuum means to hold cull formed from a molding procedure when transporting a molded substrate away from the mold.

11. Apparatus as defined in claim 1, further including a discharge station for processing a molded substrate.

12. Apparatus as defined in claim 11, including a second pressure means at the discharge station adapted to flatten a substrate after molding.

13. Apparatus as defined in claim 12, further comprising a second conveying device including the second pressure means, the second conveying device being operative to transport the molded substrate from the mold to the discharge station.

14. Apparatus as defined in claim 11, wherein the discharge station comprises a degating assembly having top and bottom degating plates.

15. Apparatus as defined in claim 11, further including pressurized air generation means coupled to the discharge station to introduce cooling air onto a molded substrate.

16. Apparatus as defined in claim 15, wherein the pressurized air generation means includes air channels adapted to direct pressurized air to a substrate and to cull formed during a molding process, there being a separate air channel for the substrate and for the cull.

17. Apparatus as defined in claim 11, further including a plurality of cooling fans to cool a substrate at the discharge station.

18. Apparatus for reducing warpage of a substrate undergoing a molding process, comprising:
a conveyor for transporting the substrate to a mold;
a pressure mechanism which moves with the conveyor and which is operable to apply pressure to the substrate during transportation to maintain the flatness thereof; and
a molding surface on the mold that is configured to receive the substrate for molding.

19. Apparatus as defined in claim 18, wherein the pressure mechanism comprises a press plate carried by the conveying device and which is adapted to apply pressure through contact with the substrate.

20. Apparatus as defined in claim 19, further including a press plate cylinder which controls the force exerted by the press plate.

21. Apparatus as defined in claim 18, wherein the substrate is transported to a mold from a delivery platform, and the delivery platform includes a gripper operable to keep the substrate substantially flat on the delivery platform.

22. Apparatus as defined in claim 18, further including an alignment mechanism located adjacent to a mold to align the substrate in relation to a reference datum to orientate it for molding.

23. Apparatus as defined in claim 22, wherein the alignment mechanism comprises a side-pusher assembly.

24. Apparatus as defined in claim 18, further including a second pressure mechanism which is operative to apply a force on the substrate to flatten it against a molding surface of a mold for a predetermined period of time.

25. Apparatus as defined in claim 24, wherein the second pressure mechanism is a surface of the conveying device.

26. Apparatus as defined in claim 18, further including a plurality of vacuum suction devices on a molding surface of the mold adapted to provide suction force to hold the substrate in position during molding.

27. Apparatus as defined in claim 18, further including a suction mechanism operative to generate a vacuum to hold cull formed from a molding procedure when transporting a molded substrate away from the mold.

28. Apparatus as defined in claim 18, further including:
a discharge station for processing a molded substrate;
a second pressure mechanism at the discharge station adapted to flatten a substrate after molding; and
a second conveying device including the second pressure mechanism, the second conveying device being operable to transport the molded substrate from the mold to the discharge station.

29. Apparatus as defined in claim 28, further including a source of pressurized air coupled to the discharge station to introduce cooling air onto a molded substrate.

30. Apparatus as defined in claim 29, wherein the source of pressurized air includes air channels adapted to direct pressurized air to a substrate and to cull formed during a molding process, there being a separate air channel for the substrate and for the cull.

* * * * *